US008728887B2

(12) United States Patent
Lee et al.

(10) Patent No.: US 8,728,887 B2
(45) Date of Patent: May 20, 2014

(54) METHOD FOR FABRICATING CAPACITOR OF SEMICONDUCTOR DEVICE

(75) Inventors: Jeong-Yeop Lee, Gyeonggi-do (KR); Hyung-Soon Park, Gyeonggi-do (KR); Young-Bang Lee, Gyeonggi-do (KR); Su-Young Kim, Gyeonggi-do (KR)

(73) Assignee: Hynix Semiconductor, Gyeonggi-do (KR)

( * ) Notice: Subject to any disclaimer, the term of this patent is extended or adjusted under 35 U.S.C. 154(b) by 0 days.

(21) Appl. No.: 13/468,319

(22) Filed: May 10, 2012

(65) Prior Publication Data

US 2013/0164903 A1    Jun. 27, 2013

(30) Foreign Application Priority Data

Dec. 26, 2011 (KR) .......................... 10-2011-0142217

(51) Int. Cl.
*H01L 21/8242* (2006.01)

(52) U.S. Cl.
USPC ..... 438/250; 438/251; 438/253; 257/E21.648

(58) Field of Classification Search
USPC .......................... 438/253, 250–252, 381–399; 257/296–313, E21.648
See application file for complete search history.

(56) References Cited

U.S. PATENT DOCUMENTS

| 6,617,222 | B1 * | 9/2003 | Coursey ......................... 438/398 |
| 7,544,563 | B2 * | 6/2009 | Manning ....................... 438/253 |
| 2001/0023110 | A1 * | 9/2001 | Fukuzumi et al. ............ 438/396 |
| 2002/0047201 | A1 * | 4/2002 | Suzuki ........................... 257/751 |
| 2005/0040448 | A1 * | 2/2005 | Park ............................... 257/296 |
| 2007/0284641 | A1 * | 12/2007 | Seo ................................. 257/304 |
| 2008/0210999 | A1 * | 9/2008 | Horikawa ...................... 257/296 |
| 2009/0085157 | A1 * | 4/2009 | Muemmler et al. .......... 257/532 |
| 2009/0275186 | A1 * | 11/2009 | Park et al. ...................... 438/396 |

* cited by examiner

*Primary Examiner* — Trung Q Dang
(74) *Attorney, Agent, or Firm* — IP & T Group LLP

(57) ABSTRACT

A method for fabricating a capacitor of a semiconductor device includes sequentially forming an etch-stop layer and a mold layer over a substrate, sequentially forming a support layer and a hard mask pattern over the mold layer, forming a storage node hole by etching the support layer and the mold layer using the hard mask pattern as an etch barrier, forming a barrier layer on the sidewall of the mold layer inside the storage node hole, etching the etch-stop layer under the storage node hole, forming a storage node inside the storage node hole, and removing the hard mask pattern, the mold layer, and the barrier layer.

11 Claims, 6 Drawing Sheets

METHOD FOR FABRICATING CAPACITOR OF SEMICONDUCTOR DEVICE

CROSS-REFERENCE TO RELATED APPLICATIONS

The present application claims priority of Korean Patent Application No. 10-2011-0142217, filed on Dec. 26, 2011, which is incorporated herein by reference in its entirety.

BACKGROUND

1. Field

Exemplary embodiments of the present invention relate to semiconductor device fabrication technology, and more particularly, to method for fabricating a capacitor of a semiconductor device.

2. Description of the Related Art

A capacitor serves as a core device to store data in DRAM, and it should have adequate capacitance for an operation of DRAM. With an increase in integration degree of DRAM, the area of a storage node may increase, in order to secure the desirable capacitance for the operation of DRAM. Accordingly, the height (or aspect ratio) of the storage node is increasing in the fabrication of DRAM.

A capacitor of a conventional semiconductor device may be formed by the following series of processes. First, a mold insulation layer is formed and selectively etched to form a storage node hole. Then, a storage node is formed in the storage node hole, a wet dip-out process is performed to remove the mold insulation layer, and a dielectric layer and a plate electrode are formed.

However, as the aspect ratio of the storage node hole is increased to secure the area of the storage node, it may be difficult to form a storage node hole having a vertical profile of sidewalls in the conventional semiconductor device. Such features may degrade the characteristic of the capacitor to be fabricated. Therefore, there is extensive research into the fabrication of the capacitor.

SUMMARY

An embodiment of the present invention is directed to a method for fabricating a capacitor of a semiconductor device, which is capable of preventing the characteristic degradation of a capacitor by forming a storage hole having a vertical profile of sidewalls.

In accordance with an exemplary embodiment of the present invention, a method for fabricating a capacitor of a semiconductor device includes sequentially forming an etch-stop layer and a mold layer over a substrate, sequentially forming a support layer and a hard mask pattern over the mold layer, forming a storage node hole by etching the support layer and the mold layer using the hard mask pattern as an etch barrier, forming a barrier layer on the sidewall of the mold layer inside the storage node hole, etching the etch-stop layer under the storage node hole, forming a storage node inside the storage node hole, and removing the hard mask pattern, the mold layer, and the barrier layer.

In accordance with another exemplary embodiment of the present invention, a method for fabricating a capacitor of a semiconductor device includes sequentially forming an etch-stop layer and a mold layer over a substrate, forming a storage node hole by selectively etching the mold layer, forming a barrier area on the surface of the mold layer by ion-implanting impurities into the sidewall of the storage node hole, etching the etch-stop layer under the storage node hole, forming a storage node inside the storage node hole, and removing the mold layer including the barrier area.

In accordance with still another exemplary embodiment of the present invention, a method for fabricating a capacitor of a semiconductor device includes: forming a mold layer over a substrate, forming a storage node hole by selectively etching the mold layer, forming a barrier area on the sidewall of the storage node hole, forming a storage node inside the storage node hole, and removing the mold layer and the barrier area.

DETAILED DESCRIPTION

Figure 1A:
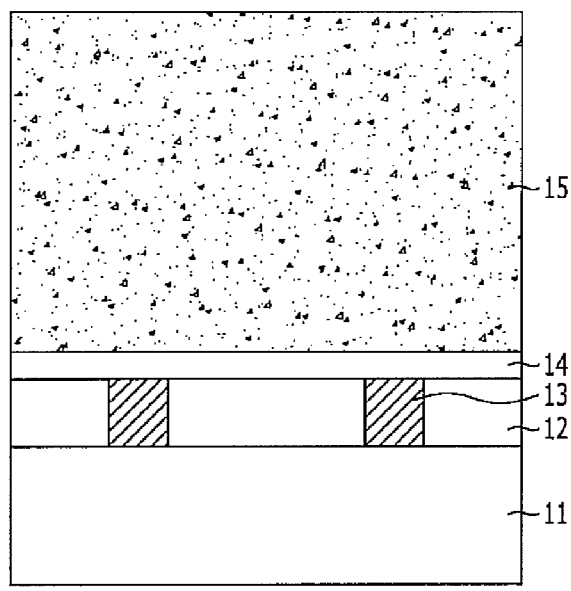
FIGS. 1A to 1F are cross-sectional views illustrating a method for fabricating a capacitor of a semiconductor device in accordance with a first exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1A to 1F are cross-sectional views illustrating a method for fabricating a capacitor of a semiconductor device in accordance with a first embodiment of the present invention.

Referring to FIG. 1A, an interlayer dielectric layer 12 including a storage node contact plug 13 is formed over a substrate 11 having certain structures formed therein. For example, a transistor, a word line, a bit line and so on may be formed in the substrate 11. The storage node contact plug 13 may be formed of a polysilicon layer.

An etch-stop layer 14 is formed over the interlayer dielectric layer 12. The etch-stop layer 14 serves to protect the structure formed under the etch-stop layer 14 during the subsequent process. Furthermore, the etch-stop layer 14 may be formed of a material having an etching selectivity with a mold layer 15 which is to be formed through the subsequent process. For example, the etch-stop layer 14 may be formed of at least one selected from the group consisting of oxide, nitride, and oxynitride.

The mold layer 15 is formed over the etch-stop layer 14. The mold layer 15 may be formed of a silicon layer instead of an insulation layer, in order to provide a vertical profile of sidewalls during a formation process of a storage node hole having a high aspect ratio.

Furthermore, impurities may be doped into the mold layer 15, in order to control etch characteristics (for example, an etch profile, an etch rate and so on), and the formation temperature of the mold layer 15 may be controlled in such a manner that the mold layer 15 has a polycrystal state or an amorphous state. For example, when the mold layer 15 is formed of a silicon layer, boron (B) or phosphorus (P) may be doped into the silicon layer, and the deposition temperature thereof may be controlled in the range of 300° C. to 900° C. to form a polycrystal silicon layer or amorphous silicon layer.

A planarization process is performed to increase the surface uniformity of the mold layer 15. At this time, the planarization process may include chemical mechanical polishing (CMP). As the surface uniformity of the mold layer 15 is increased, the subsequent hard mask pattern may be formed with more precision. Accordingly, a process margin of the storage node hole formation process may be increased.

Figure 1B:
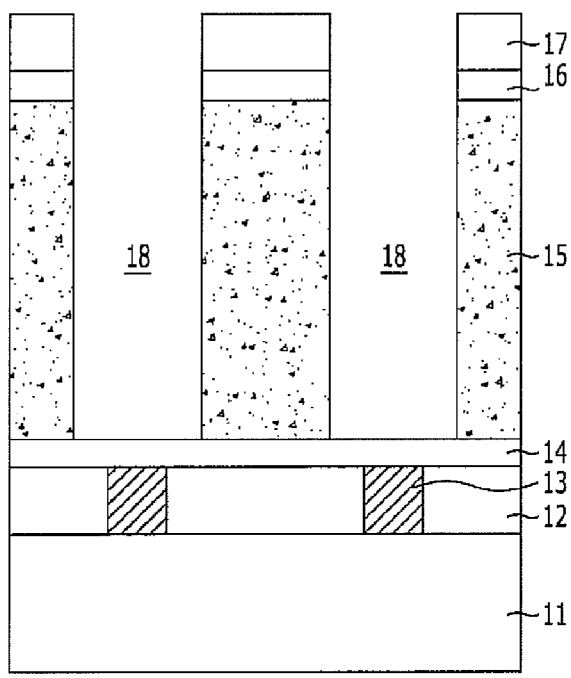

Referring to FIG. 1B, a support layer 16 is formed over the mold layer 15. The support layer 16 serves to prevent a storage node from collapsing during the subsequent removal process of the mold layer 15, for example, during a wet dip-out process. The support layer 16 may be formed of a material having an etching selectivity with the mold layer 15. For example, the support layer 16 may be formed of nitride.

A hard mask pattern 17 is formed over the support layer 16. The hard mask pattern 17 serves as an etch barrier during the subsequent storage node hole formation process. Therefore, the hard mask pattern 17 may include a stacked layer of an insulation layer and a carbon containing layer, in order to secure an etch margin and provide a vertical sidewall profile. For example, the hard mask pattern 17 may include a stacked layer of an oxide layer (for example, TEOS (Tetra-Ethyl Ortho-Silicate)) and an amorphous carbon layer.

A storage node hole 18 is formed by etching the support layer 16 and the mold layer 15 using the hard mask pattern 17 as an etch barrier until the etch-stop layer 14 is exposed. When the mold layer 15 is formed of a silicon layer, the etch process may be performed by using a gas mixture in which HBr, $NF_3$, $O_2$, and Ar are mixed.

For reference, when the mold layer 15 is formed of an insulation layer as in the conventional semiconductor device, etching is performed by a physical method during the formation process of the storage node hole 18. This is because it is difficult to etch the insulation layer through a chemical reaction and it takes a long time to perform the etching. At this time, when the storage node hole 18 is formed by the physical method, the sidewall of the storage node hole 18 may be inclined due to the etching characteristics of the physical method. In this case, a bottom CD may be reduced, not-open may occur, or a bowing profile may be formed. However, when the mold layer 15 is formed of a silicon layer which may be easily etched through a chemical reaction, a bowing profile may be prevented from being formed at the sidewall of the storage node hole 18. Accordingly, since over-etching may be performed during a sufficient time, the reduction of the bottom CD and the occurrence of pot-open may be prevented.

Figure 1C:
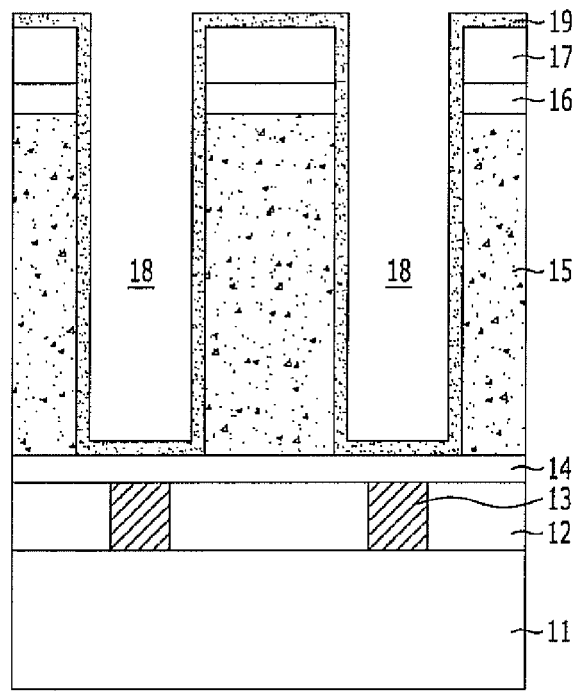

Referring to FIG. 1C, a barrier layer 19 is formed along the surface of the structure including the storage node hole 18. The barrier layer 19 serves to prevent the properties of the mold layer 15 from changing on contact with a storage node. For reference, when the mold layer 15 is formed of a silicon layer and the storage node is formed of a metal layer through the subsequent process, the properties of the mold layer 15 in contact with the storage node are changed. That is, an unintended material layer (for example, metal silicide layer) may be formed on the contact surface of the mold layer 15 with the storage node. At this time, the material layer which is formed while the properties of the mold layer 15 are changed is not removed but remains, during a wet dip-out process for removing the mold layer 15. Accordingly, the material layer serves as a factor which degrades the characteristic of the capacitor. Therefore, when the mold layer 15 is formed of a silicon layer, a structure capable of preventing the properties of the mold layer 15 from changing on contact with the storage node is to be formed. In the first embodiment of the present invention, the barrier layer 19 is formed along the surface of the structure including the storage node hole 18, and serves as the above-described structure.

The barrier layer 19 may be formed of a material which prevents the change in properties of the mold layer 15 and is easily removed during the subsequent process (for example, a wet dip-out process). For example, the barrier layer 19 may be formed of at least one selected from the group consisting of zirconium oxide ($ZrO_2$), hafnium oxide ($HfO_2$), aluminum oxide ($Al_2O_3$), titanium oxide ($TiO_2$), tantalum oxide ($Ta_2O_5$), niobium oxide ($Nb_2O_5$), and silicon oxide ($SiO_2$).

Figure 1D:
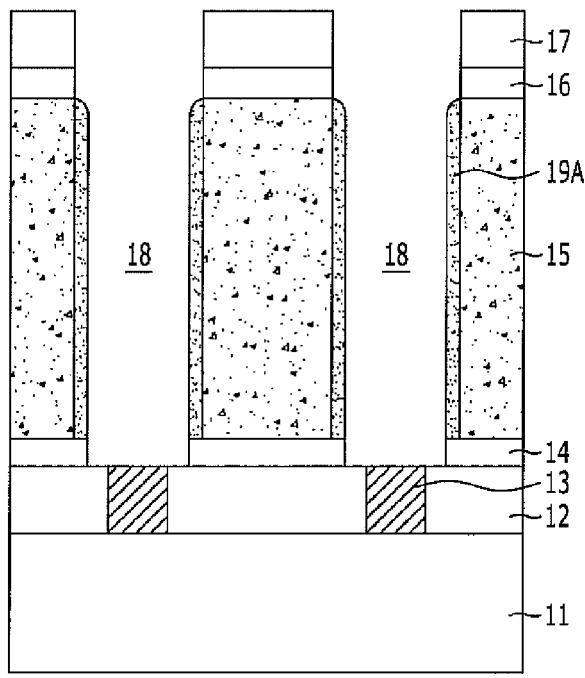

Referring to FIG. 1D, the barrier layer 19 is selectively etched in such a manner as to remain in the form of a spacer on the sidewall of the storage node hole 18 and expose the sidewall of the support layer 16. At this time, the etch process may include a blanket etch process, for example, an etch-back process. Hereinafter, the barrier layer 19 having a spacer shape is represented by '19A'.

Here, when the barrier layer 19A is formed in the storage node hole 18 so as to remain only on the sidewall of the mold layer 15, that is, when the barrier layer 19A is formed in the storage node hole 18 so as to expose the sidewall of the support layer 16, an adhesive force between the storage node and the support layer 16 may be prevented from being reduced by the barrier layer 19A.

The etch-stop layer 14 is etched to expose the storage node contact plug 13 under the storage node hole 18. At this time, when the etch-stop layer 14 is etched after the barrier layer 19A is formed, the storage node contact plug 13 may be prevented from being damaged during the formation process of the barrier layer 19A.

Figure 1E:
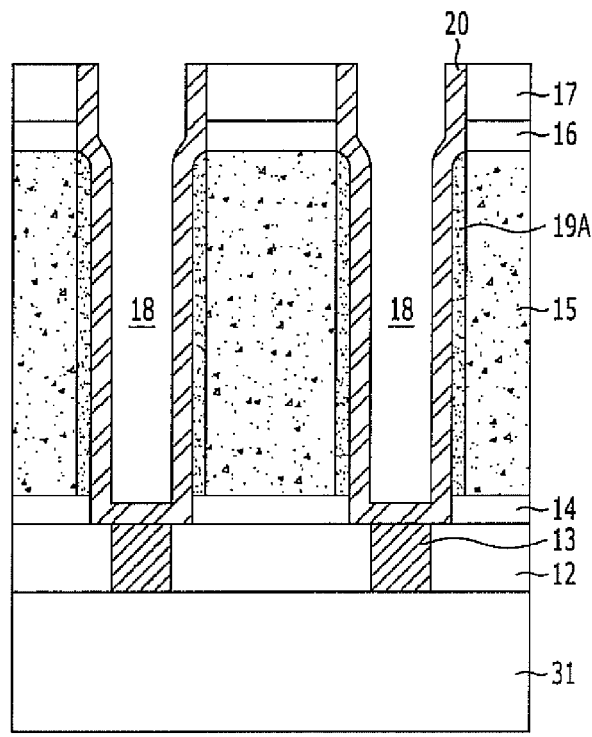

Referring to FIG. 1E, the storage node 20 is formed inside the storage node hole 18. The storage node 20 may include a metallic layer and may be formed in a cylinder shape or a pillar shape. In the first embodiment of the present invention, the storage node 20 is formed in a cylinder shape. For reference, the metallic layer includes a metal layer, a metal oxide layer, a metal nitride layer, and a metal silicide layer.

The storage node 20 may be formed by the following series of processes: a stacked layer of a barrier metal layer and a storage node conductive layer is formed along the surface of the structure including the storage node hole 18 and a blanket etch process (for example, an etch-back process) is then performed to separate adjacent storage nodes 20. At this time, while the barrier metal layer and the storage node conductive layer are formed, they may react with the mold layer 15 such that the properties of the mold layer 15 are changed. However, the barrier layer 19A may prevent the change in properties of the mold layer 15.

Meanwhile, before the storage node 20 is formed, an ohmic contact layer (not illustrated) may be formed to reduce contact resistance between the storage node 20 and the storage node contact plug 13. Therefore, during the formation process of the ohmic contact layer, the barrier layer 19A may prevent the change in properties of the mold layer 15.

Figure 1F:
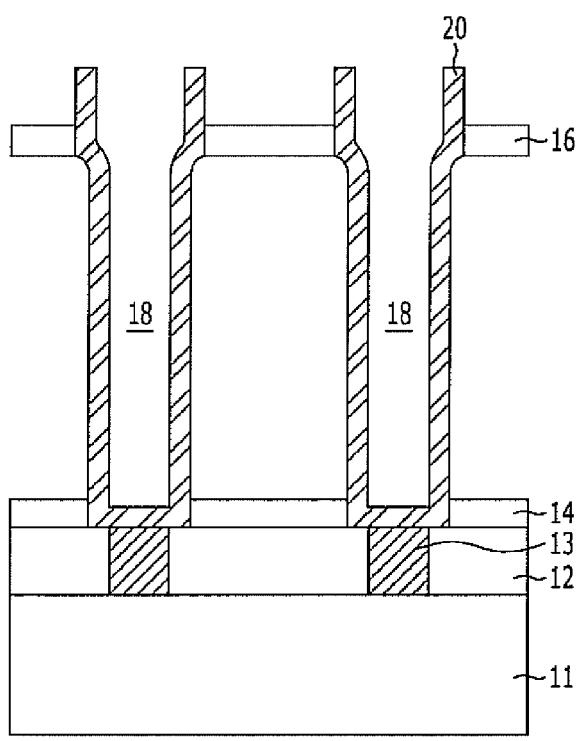

Referring to FIG. 1F, the hard mask pattern 17, the mold layer 15, and the barrier layer 19A are removed. At this time, the hard mask pattern 17, the mold layer 15, and the barrier layer 19A may be removed at the same time or individually in consideration of the properties of the respective layers. For example, the mold layer 15 may be removed through a wet dip-out process. When the mold layer 15 is formed of a silicon layer, an ammonia solution or an NFM solution in which nitric acid and HF are mixed may be used as an etching solution. The concentration of the ammonia solution or NFM solution may be controlled by mixing (or diluting) the solution with de-ionized water, and an additive for controlling the selectivity and the etch rate may be added.

Then, although not illustrated, a dielectric layer and a plate electrode are sequentially formed to complete the capacitor of the semiconductor device.

In accordance with the first embodiment of the present invention, as the mold layer 15 is formed of a silicon layer instead of an insulation layer, the storage node hole 18 having a vertical profile of sidewalls may be provided.

Furthermore, as the barrier layer 19A is formed on the sidewall of the mold layer 15 inside the storage node hole 18, the properties of the mold layer 15 may be prevented from changing on contact with the storage node 20.

FIGS. 2A to 2E are cross-sectional views illustrating a method for fabricating a capacitor of a semiconductor device in accordance with a second exemplary embodiment of the present invention.

Figure 2A:
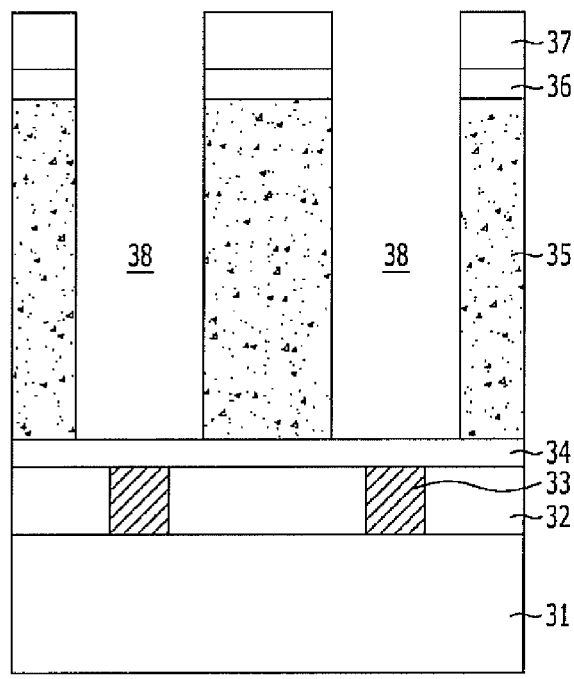
FIGS. 2A to 2E are cross-sectional views illustrating a method for fabricating a capacitor of a semiconductor device in accordance with a second exemplary embodiment of the present invention.

Referring to FIG. 2A, an interlayer dielectric layer 32 including a storage node contact plug 33 is formed over a substrate 31 having certain structures formed therein. For example, a transistor, a word line, a bit line and so on may be formed in the substrate 11. The storage node contact plug 33 may be formed of a polysilicon layer.

An etch-stop layer 34 is formed over the interlayer dielectric layer 32. The etch-stop layer 34 serves to protect the structure formed under the etch-stop layer 34 during the subsequent process. Furthermore, the etch-stop layer 34 may be formed of a material having an etching selectivity with a mold layer 35 which is to be formed through the subsequent process. For example, the etch-stop layer 34 may be formed of at least one selected from the group consisting of oxide, nitride, and oxynitride.

The mold layer 35 is formed over the etch-stop layer 34. The mold layer 35 may be formed of a silicon layer instead of an insulation layer, in order to provide a vertical profile of sidewalls during a formation process of a storage node hole having a high aspect ratio. Furthermore, impurities may be doped into the mold layer 35, in order to control etch characteristics (for example, an etch profile, an etch rate and so on), and the formation temperature of the mold layer 35 may be controlled in such a manner that the mold layer 35 has a polycrystal state or an amorphous state. For example, when the mold layer 35 is formed of a silicon layer, B or P may be doped into the silicon layer, and the deposition temperature thereof may be controlled in the range of 300° C. to 900° C. to form a polycrystal silicon layer or amorphous silicon layer.

A planarization process is performed to increase the surface uniformity of the mold layer 35. At this time, the planarization may include CMP. As the surface uniformity of the mold layer 35 is increased, the subsequent hard mask pattern may be formed with more precision. Accordingly, a process margin of a storage node hole formation process may be increased.

A support layer 36 is formed over the mold layer 35. The support layer 36 serves to prevent a storage node from collapsing during a removal process of the mold layer 35, for example, during a wet dip-out process. The support layer 36 may be formed of a material having an etching selectivity with the mold layer 35. For example, the support layer 36 may be formed of nitride.

A hard mask pattern 37 is formed over the support layer 36. The hard mask pattern 37 serves as an etch barrier during the subsequent storage node hole formation process. Therefore, the hard mask pattern 37 may include a stacked layer of an insulation layer and a carbon containing layer, in order to secure an etch margin and provide a vertical sidewall profile. For example, the hard mask pattern 37 may include a stacked layer of an oxide layer (for example, TEOS) and an amorphous carbon layer.

A storage node hole 38 is formed by etching the support layer 36 and the mold layer 35 using the hard mask pattern 37 as an etch barrier until the etch-stop layer 34 is exposed. When the mold layer 35 is formed of a silicon layer, the etching process may be performed by using a gas mixture in which HBr, $NF_3$, $O_2$, and Ar are mixed.

Figure 2B:
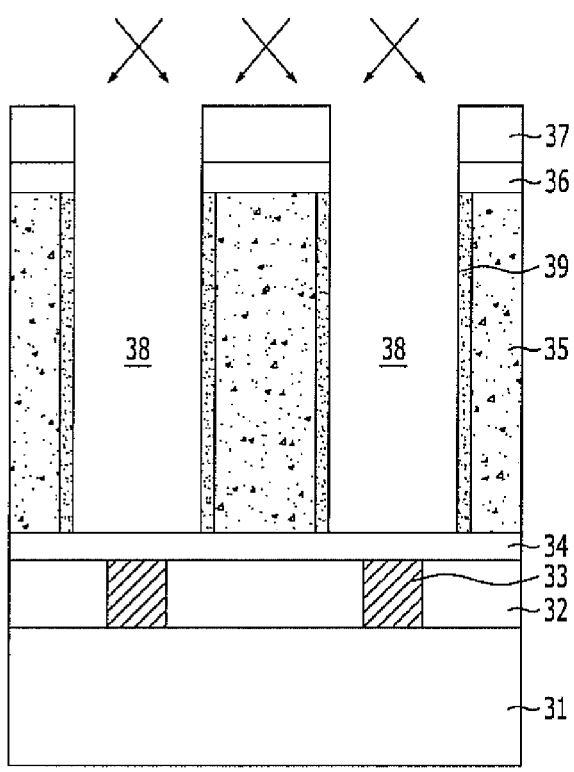

Referring to FIG. 2B, a barrier area 39 is formed by ion-implanting impurities into the surface of the mold layer 35 inside the storage node hole 38. The barrier area 39 serves to prevent the properties of the mold layer 35 from changing on contact with a storage node.

The barrier area 39 may be formed so as to be easily removed during the subsequent process (for example, a wet-dip out process), while preventing the change in properties of the mold layer 35 during the formation of the storage node. Therefore, the impurities used for forming the barrier area 39 may include all kinds of materials capable of satisfying the above-described conditions. For example, the impurities for forming the barrier area 39 may include at least one selected from the group consisting of As, B, and P.

The barrier area 39 may be formed by a tilt ion implantation process while the substrate 31 is rotated through 360 degrees, in order to form the barrier area 39 on the entire surface of the mold layer 35 exposed through the storage node hole 38.

During the ion implantation process for forming the barrier area 39, the etch-stop layer 34 may prevent impurities from being implanted into the storage node contact plug 33. Furthermore, as the barrier area 39 is formed on the surface of the mold layer 35 through the ion implantation process, the difficulty degree of the process may be further reduced than in the first embodiment of the present invention, the fabrication process may be simplified, and the internal volume of the storage node hole 38 may be increased.

Figure 2C:
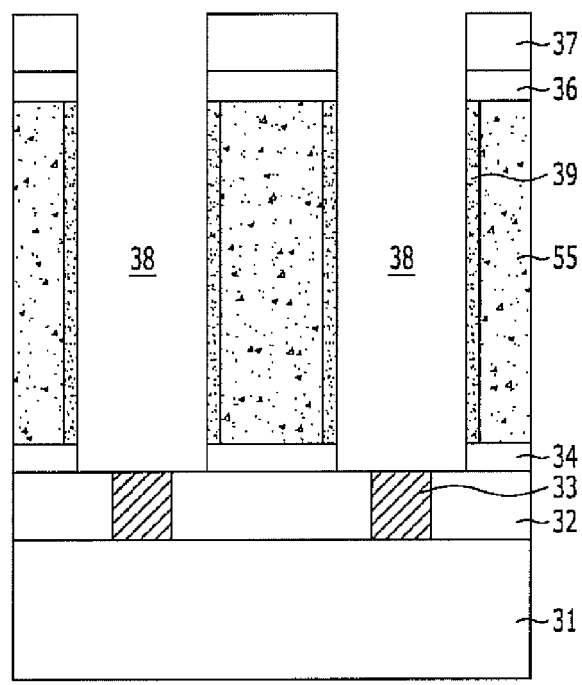

Referring to FIG. 2C, a secondary etching process is performed as follows: the etch-stop layer 34 is etched using the hard mask pattern 37 as an etch barrier, until the storage node contact plug 33 under the storage node hole 38 is exposed.

Figure 2D:
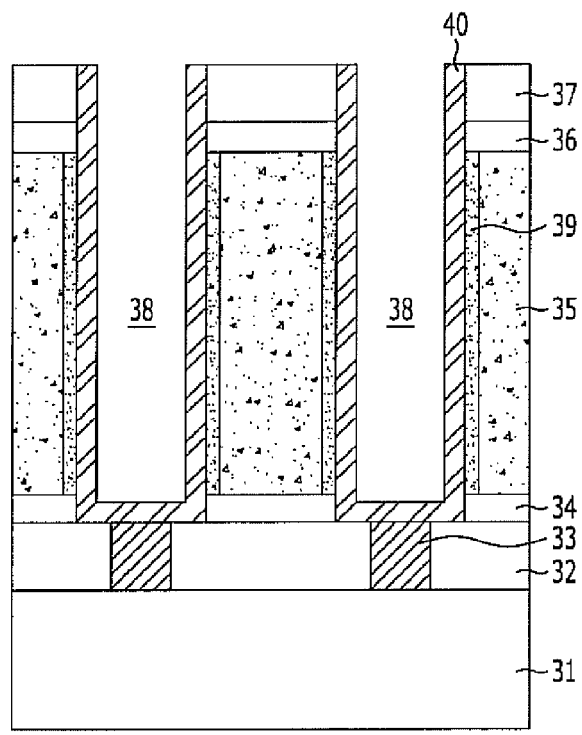

Referring to FIG. 2D, a storage node 40 is formed inside the storage node hole 38. The storage node 40 may be formed of a metallic layer and may have a cylinder shape or a pillar shape. In the second embodiment of the present invention, the storage node 40 is formed in a cylinder shape. For reference, the metallic layer includes a metal layer, a metal oxide layer, a metal nitride layer, and a metal silicide layer.

The storage node 40 may be formed by the following series of processes: a stacked layer of a barrier metal layer and a storage node conductive layer is formed along the surface of the structure including the storage node hole 38 and a blanket etch process (for example, an etch-back process) is then performed to separate adjacent storage nodes 40. At this time, while the barrier metal layer and the storage node conductive layer are formed, they may react with the mold layer 15 such that the properties of the mold layer 15 are changed. However, the barrier area 39 may prevent the change in properties of the mold layer 35.

Meanwhile, before the storage node 40 is formed, an ohmic contact layer (not illustrated) may be formed to reduce contact resistance between the storage node 40 and the storage node contact plug 33. Therefore, during the formation process of the ohmic contact layer, the barrier area 39 may prevent the change in properties of the mold layer 35.

Figure 2E:
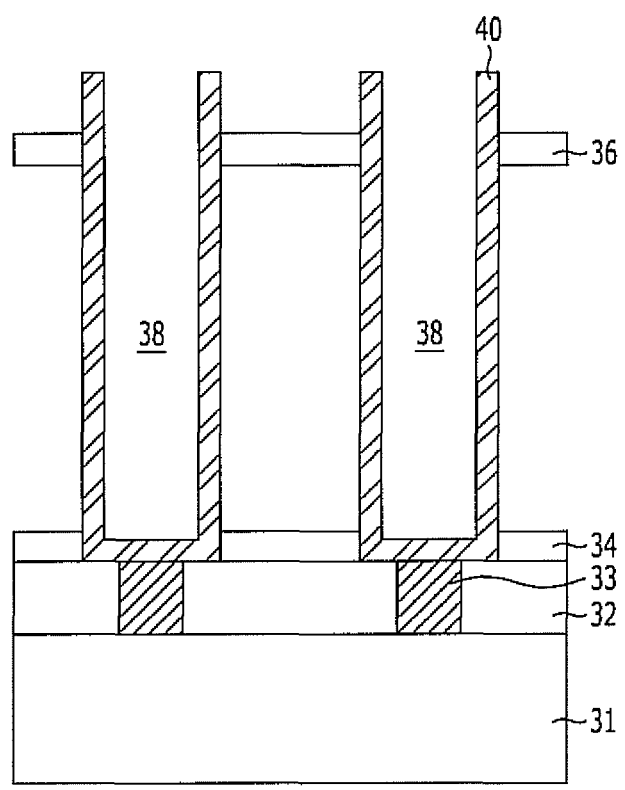

Referring to FIG. 2E, the hard mask pattern 37 and the mold layer 35 including the barrier area 39 are removed. At this time, the hard mask pattern 37 and the mold layer 35 including the barrier area 39 may be removed at the same time or individually in consideration of the properties of the respective layers. For example, the mold layer 35 including the barrier area 39 may be removed through a wet dip-out process. When the mold layer 35 is formed of a silicon layer, an ammonia solution or an NFM solution in which nitric acid and HF are mixed may be used as an etching solution. The concentration of the ammonia solution or NFM solution may be controlled by mixing (or diluting) the solution with de-ionized water, and an additive for controlling the selectivity and the etch rate may be added.

Then, although not illustrated, a dielectric layer and a plate electrode are sequentially formed to complete the capacitor of the semiconductor device.

In accordance with the second exemplary embodiment of the present invention, as the mold layer 35 is formed of a silicon layer instead of an insulation layer, the storage node hole 38 having a vertical profile of sidewalls may be provided.

Furthermore, as the barrier area 39 is formed on the sidewall of the mold layer 35 inside the storage node hole 38, the properties of the mold layer 35 may be prevented from changing on contact with the storage node 40.

In accordance with the exemplary embodiments of the present invention, as the mold layer is formed of a silicon layer instead of an insulation layer, the storage node hole having a vertical profile of sidewalls may be provided.

Furthermore, as the barrier layer or the barrier area is formed on the surface of the mold layer inside the storage node hole, the properties of the mold layer may be prevented from changing on contact with the storage node.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a capacitor of a semiconductor device, comprising:
    sequentially forming an etch-stop layer and a mold layer comprising a silicon layer over a substrate;
    sequentially forming a support layer and a hard mask pattern over the mold layer;
    forming a storage node hole by etching the support layer and the mold layer using the hard mask pattern as an etch barrier;
    forming a barrier layer on the sidewall of the mold layer inside the storage node hole;
    etching the etch-stop layer under the storage node hole;
    forming a storage node inside the storage node hole; and
    removing the hard mask pattern, the mold layer, and the barrier layer,
    wherein the forming of a barrier layer, comprises:
        forming the barrier layer along the surface of the structure including the storage node hole; and
        etching the barrier layer to expose the sidewall of the support layer and form the barrier layer on the sidewall of the mold layer.

2. The method of claim 1, wherein the etching the layer is performed by performing a blanket etch process.

3. The method of claim 1, wherein the barrier layer comprises at least one selected from the group consisting of zirconium oxide ($ZrO_2$), hafnium oxide ($HfO_2$), aluminum oxide ($Al_2O_3$), titanium oxide ($TiO_2$), tantalum oxide ($Ta_2O_5$), niobium oxide ($Nb_2O_5$), and silicon oxide ($SiO_2$).

4. A method for fabricating a capacitor of a semiconductor device, comprising:
    forming a mold layer comprising a silicon layer over a substrate;
    forming a storage node hole by selectively etching the mold layer;
    forming a barrier area on the sidewall of the mold layer by an ion implantation process;
    forming a storage node inside the storage node hole; and
    removing the mold layer and the barrier area.

5. The method of claim 4, further comprising:
    forming an etch-stop layer over the substrate, before the forming of the mold layer; and
    forming a support layer and a hard mask pattern over the mold layer, before the forming of the storage node hole.

6. The method of claim 5, wherein the forming of the storage node hole comprises etching the support layer and the mold layer by using the hard mask layer as an etch barrier, until the etch-stop layer is exposed.

7. The method of claim 5, wherein the forming of the barrier area comprise:
    forming a barrier layer along the surface of the support and mold layers including the storage node hole; and
    etching the barrier layer by performing a blanket etch process to expose the sidewall of the support layer and form the barrier area on the sidewall of the mold layer.

8. The method of claim 5, further comprising etching the etch-stop layer under the storage node hole after the forming of the barrier area.

9. The method of claim 7, wherein the barrier layer comprises at least one selected from the group consisting of zirconium oxide ($ZrO_2$), hafnium oxide ($HfO_2$), aluminum oxide ($Al_2O_3$), titanium oxide ($TiO_2$), tantalum oxide ($Ta_2O_5$), niobium oxide ($Nb_2O_5$), and silicon oxide ($SiO_2$).

10. The method of claim 5, wherein the removing of the mold layer and barrier area comprising removing the hard mask pattern,
    wherein the support layer remains in contact with the storage node.

11. The method of claim 4, further comprising performing a planarization process on the surface of the mold layer, after the forming of the mold layer.

* * * * *